(12) United States Patent
Cho et al.

(10) Patent No.: US 11,842,681 B2
(45) Date of Patent: Dec. 12, 2023

(54) DISPLAY DEVICE AND METHOD OF MANUFACTURING THE SAME

(71) Applicant: Samsung Display Co., Ltd., Yongin-si (KR)

(72) Inventors: Hyun Min Cho, Yongin-si (KR); Sung Chul Kim, Yongin-si (KR); Dae Hyun Kim, Yongin-si (KR); Hye Yong Chu, Yongin-si (KR); Jong Hyuk Kang, Yongin-si (KR); Keun Kyu Song, Yongin-si (KR); Joo Yeol Lee, Yongin-si (KR); Bek Hyun Lim, Yongin-si (KR); Hyun Deok Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/384,556

(22) Filed: Jul. 23, 2021

(65) Prior Publication Data

US 2021/0350746 A1    Nov. 11, 2021

Related U.S. Application Data

(63) Continuation of application No. 16/214,786, filed on Dec. 10, 2018, now Pat. No. 11,074,858.

(30) Foreign Application Priority Data

Feb. 8, 2018   (KR) .................. 10-2018-0015897

(51) Int. Cl.
*G09G 3/3233* (2016.01)
*H01L 33/20* (2010.01)
(Continued)

(52) U.S. Cl.
CPC ....... *G09G 3/3233* (2013.01); *H01L 25/0753* (2013.01); *H01L 25/167* (2013.01);
(Continued)

(58) Field of Classification Search
CPC . G09G 3/3233; H01L 25/167; H01L 25/0753; H01L 33/38; H01L 33/52;
(Continued)

(56) References Cited

U.S. PATENT DOCUMENTS 8,872,214 B2   10/2014   Negishi et al.
9,112,112 B2    8/2015   Do et al.
(Continued)

FOREIGN PATENT DOCUMENTS

KR   10-1244926 B1   3/2013
KR   10-1490758 B1   2/2015
(Continued)

*Primary Examiner* — Lunyi Lao
*Assistant Examiner* — Kebede T Teshome
(74) *Attorney, Agent, or Firm* — Lewis Roca Rothgerber Christie LLP

(57) ABSTRACT

A display device includes: a substrate; a display element layer on one surface of the substrate and including at least one light emitting element emitting light; and a pixel circuit portion on the display element layer and including at least one transistor electrically connected to the light emitting element, wherein the display element layer includes: a first electrode on the substrate and electrically connected to one end of the light emitting element; a second electrode on the substrate and electrically connected to the other end of the light emitting element; and an insulation layer on the substrate including the second electrode, and having a first opening exposing a portion of the second electrode, and wherein the second electrode is electrically connected to the transistor through the first opening.

15 Claims, 13 Drawing Sheets

(51) Int. Cl.
*H01L 33/00* (2010.01)
*H01L 33/44* (2010.01)
*H01L 33/52* (2010.01)
*H01L 33/38* (2010.01)
*H01L 25/075* (2006.01)
*H01L 25/16* (2023.01)
*H05B 45/40* (2020.01)
*H01L 33/62* (2010.01)

(52) U.S. Cl.
CPC .......... *H01L 33/0095* (2013.01); *H01L 33/20* (2013.01); *H01L 33/38* (2013.01); *H01L 33/44* (2013.01); *H01L 33/52* (2013.01); *H05B 45/40* (2020.01); *H01L 33/62* (2013.01)

(58) Field of Classification Search
CPC ..... H01L 33/44; H01L 33/0095; H01L 33/20; H01L 33/62; H05B 33/0821
See application file for complete search history.

(56) References Cited

U.S. PATENT DOCUMENTS

| | | |
|---|---|---|
| 9,773,761 B2 | 9/2017 | Do |
| 2011/0089850 A1 | 4/2011 | Shibata et al. |
| 2016/0071916 A1* | 3/2016 | Kim .................... H10K 59/1216 438/23 |
| 2016/0216800 A1* | 7/2016 | Cho ..................... G02F 1/13338 |
| 2016/0299387 A1* | 10/2016 | Yamazaki ......... G02F 1/133514 |
| 2017/0139274 A1 | 5/2017 | Hirota |
| 2017/0141279 A1 | 5/2017 | Do et al. |
| 2018/0108704 A1* | 4/2018 | Jang ........................ H01L 33/60 |
| 2018/0122837 A1* | 5/2018 | Kang ..................... H01L 27/124 |
| 2019/0096324 A1 | 3/2019 | Soda |

FOREIGN PATENT DOCUMENTS

| | | |
|---|---|---|
| KR | 10-2018-0007025 A | 1/2018 |
| KR | 10-2018-0007376 A | 1/2018 |
| KR | 10-2018-0009014 A | 1/2018 |
| KR | 10-1987196 B1 | 6/2019 |

* cited by examiner

DISPLAY DEVICE AND METHOD OF MANUFACTURING THE SAME

CROSS-REFERENCE TO RELATED APPLICATIONS

This application is a continuation of U.S. patent application Ser. No. 16/214,786, filed Dec. 10, 2018, which claims priority to and the benefit of Korean Patent Application No. 10-2018-0015897, filed Feb. 8, 2018, the entire content of both of which is incorporated herein by reference.

BACKGROUND

1. Field

Aspects of some example embodiments relate to a display device and a method of manufacturing the same.

2. Discussion of Related Art

Light emitting diodes (hereinafter referred to as LEDs) exhibit relatively good durability even under adverse environmental conditions and have excellent performance in terms of lifetime and luminance.

In recent years, research for applying such LEDs to various display devices has been actively conducted.

As a part of this research, a technique for manufacturing ultra-small rod-like LEDs, such as on a microscale or a nanoscale, using an inorganic crystal structure, for example, a structure where a nitride-based semiconductor is grown is being developed. For example, the rod-like LEDs may be manufactured to a small size enough to constitute a pixel or the like of a self-emission display device.

The above information disclosed in this Background section is only for enhancement of understanding of the background and therefore it may contain information that does not constitute prior art.

SUMMARY

One or more embodiments include a display device and a method of manufacturing the same which may prevent or reduce defects of the display device.

According to some embodiments, a display device may include a substrate; a display element layer disposed on one surface of the substrate and including at least one light emitting element emitting light; and a pixel circuit portion disposed on the display element layer and including at least one transistor electrically connected to the light emitting element, wherein the display element layer includes: a first electrode on the substrate and electrically connected to one end of the light emitting element; a second electrode on the substrate and electrically connected to the other end of the light emitting element; and an insulation layer on the substrate including the second electrode and having a first opening exposing a portion of the second electrode, and wherein the second electrode is electrically connected to the transistor through the first opening.

The display element layer may further include a first conductive electrode disposed adjacent to the one end of the light emitting element and a second conductive electrode disposed adjacent to the other end of the light emitting element, and the first conductive electrode and the second conductive electrode may be spaced apart from each other with the light emitting element interposed therebetween.

The first conductive electrode may include a cathode electrode and the second conductive electrode may include an anode electrode.

The first electrode may be on the first conductive electrode and the one end of the light emitting element and may electrically connect the first conductive electrode and the one end of the light emitting element, and the second electrode may be on the second conductive electrode and the other end of the light emitting element and may electrically connect the second conductive electrode and the other end of the light emitting element.

The insulation layer may include a first insulation layer on the second electrode and a second insulation layer on the first insulation layer to flatten a surface of the first insulation layer. In addition, the first opening may penetrate through the first and second insulation layers to expose the portion of the second electrode. In addition, the insulation layer may further include a second opening exposing a portion of the first electrode. The second opening may penetrate through the first and second insulation layers to expose the portion of the first electrode.

The transistor may include a semiconductor layer disposed on the second insulation layer, a gate electrode disposed on the semiconductor layer with a first gate insulation layer interposed therebetween, and source and drain electrodes connected to the semiconductor layer. In addition, the drain electrode may include a first portion connected to the semiconductor layer and a second portion connected to the second electrode through the second opening.

The drain electrode may be disposed on the gate electrode with a second gate insulation layer interposed therebetween and the source electrode may be disposed on the drain electrode with an interlayer insulating layer interposed therebetween.

The second electrode may be a reflective electrode that reflects the light emitted from the light emitting element toward the other surface of the substrate.

The display device may further comprise a polarizing film disposed on the other surface of the substrate.

The display device may further comprise a reflective electrode disposed between the one surface of the substrate and the display element layer.

The reflective electrode may reflect the light emitted from the light emitting element toward the one surface of the substrate.

The display device may further comprise a polarizing film disposed on the pixel circuit portion.

The pixel circuit portion may include a driving voltage line disposed on the first gate insulation layer, and a bridge pattern disposed on the second gate insulation layer and electrically connected to the driving voltage line and the first electrode.

The bridge pattern may include a first bridge pattern connected to the first electrode through the second opening and a second bridge pattern connected to the driving voltage line. In addition, the first bridge pattern and the second bridge pattern may be integrally provided.

The first electrode may be electrically connected to the driving voltage line through the bridge pattern.

The light emitting element may include a light emitting diode in the form of a cylindrical column or a polygonal column having a microscale or a nanoscale size.

According to some embodiments, a method of manufacturing the display device may include providing a substrate; forming a display element layer including at least one light emitting element emitting light on one surface of the substrate; and forming a pixel circuit portion including at least one transistor electrically connected to the light emitting element on the display element layer, wherein the forming the display element layer comprises: forming a first conductive electrode and a second conductive electrode spaced apart from the first electrode on the one surface of the substrate; self-aligning the light emitting element on the one surface of the substrate by supplying power to the first conductive electrode and the second conductive electrode, respectively; forming a first electrode electrically connecting one end of the light emitting element and the first conductive electrode; forming a second electrode electrically connecting the other end of the light emitting element and the second conductive electrode; and forming an insulating material layer on the second electrode to cover the second electrode.

The method may further include ohmic contacting the first electrode and the one end of the light emitting element by heat-treating an interface between the first electrode and the one end of the light emitting element by using a rapid thermal annealing (RTA) method; and ohmic contacting the second electrode and the other end of the light emitting element by heat-treating an interface between the second electrode and the other end of the light emitting element by using a rapid thermal annealing (RTA) method.

The first electrode may include a cathode electrode and the second electrode may include an anode electrode.

The second electrode may be a reflective electrode that reflects the light emitted from the light emitting element toward the other surface of the substrate.

The method further include forming a polarizing film on the other surface of the substrate.

The method may further include forming a reflective electrode between the one surface of the substrate and the display element layer.

The method may further include forming a polarizing film on the pixel circuit portion.

The providing the pixel circuit portion may include forming a semiconductor layer including a source region, a channel region, and a drain region on the insulating material layer; forming a first gate insulating material layer on the semiconductor layer; forming a gate electrode and a driving voltage line on the first gate insulating material layer; forming a second gate insulating material layer on the gate electrode and the driving voltage line; etching the second gate insulating material layer to expose a portion of the driving voltage line, etching the first and second gate insulating material layers to form a contact hole exposing the drain region, and simultaneously etching the first and second gate insulating material layers and the insulating material layer to form first and second openings exposing portions of the first and second electrodes, respectively; forming a bridge pattern connected to an exposed driving voltage line and the first electrode and a drain electrode connected to an exposed drain region and the second electrode; forming an interlayer insulating material layer on the substrate including the bridge pattern and the drain electrode; etching the interlayer insulating material layer, the second gate insulating material layer, and the first gate insulating material layer to form an interlayer insulation layer exposing the source region, a second gate insulation layer, and a first gate insulation layer; and forming a source electrode connected to the source region.

BRIEF DESCRIPTION OF THE DRAWINGS

The accompanying drawings, which are included to provide a further understanding of the inventive concepts, and are incorporated in and constitute a part of this specification, illustrate aspects of example embodiments of the inventive concepts, and, together with the description, serve to explain aspects of some principles of the inventive concepts.

DETAILED DESCRIPTION

Figure 1:
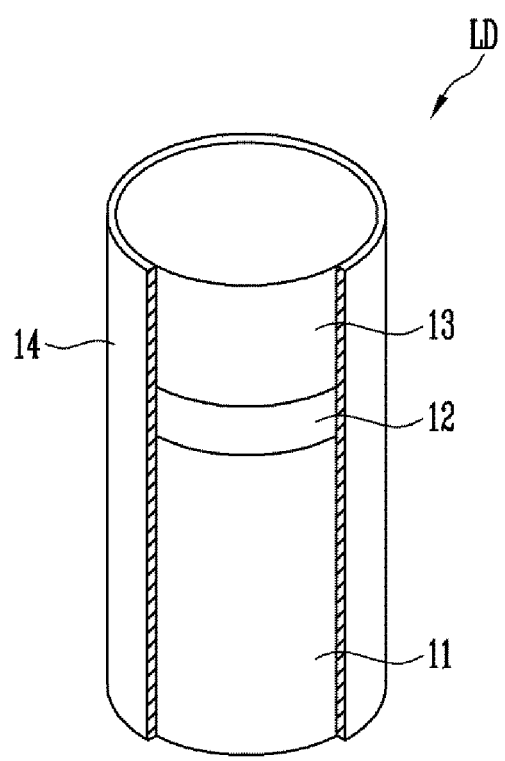
FIG. 1 is a perspective view illustrating a rod-like light emitting diode according to some example embodiments of the invention.

Reference will now be made in detail to various embodiments of the present disclosure, specific examples of which are illustrated in the accompanying drawings and described below, because the embodiments of the present disclosure may be variously modified in many different forms. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Hereinafter, aspects of some example embodiments of the present invention will be described in more detail with reference to the accompanying drawings.

FIG. 1 is a perspective view illustrating a rod-like light emitting diode according to some example embodiments of the invention. In FIG. 1, a rod-like light emitting diode LD in the form of a cylindrical column is shown, but the invention is not limited thereto.

Referring to FIG. 1, the rod-like light emitting diode LD according to some example embodiments of the invention may include a first conductive semiconductor layer 11, a second conductive semiconductor layer 13, and an active layer 12 positioned between the first conductive semiconductor layer 11 and the second conductive semiconductor layer 13. For example, the rod-like light emitting diode LD may be formed as a laminate in which the first conductive semiconductor layer 11, the active layer 12, and the second conductive semiconductor layer 13 are sequentially stacked. In the following embodiments, the rod-like light emitting diode LD is referred to as "a rod-like LED LD".

According to some example embodiments of the invention, the rod-like LED LD may be provided in a rod shape extending along one direction. When an extension direction of the rod-like LED LD is a longitudinal direction, the rod-like LED LD may have one end and the other end along the extension direction. According to some example embodiments of the invention, one of the first conductive semiconductor layer 11 and the second conductive semiconductor layer 13 may be positioned at the one end of the rod-like LED LD and the other one of the first conductive semiconductor layer 11 and the second conductive semiconductor layer 13 may be positioned at the other end thereof.

In FIG. 1, the rod-like LED LD may be provided in a cylindrical column shape, but embodiments of the present invention are not limited thereto. The term "rod-like" may include a rod or bar shape extending along the longitudinal direction and having an aspect ratio greater than 1 such as a cylindrical column, a polygonal column, or the like. For example, the length of the rod-like LED LD may be greater than the diameter thereof.

For example, the rod-like LED LD may be manufactured to a small size to have a diameter and/or length on the order of microscale or a nanoscale. The size of the rod-like LED LD according to some example embodiments of the present invention are not limited thereto and may be changed to meet the requirements of a display device to which the rod-like LED LD is applied.

The first conductive semiconductor layer 11 may include at least one n-type semiconductor layer. For example, the first conductive semiconductor layer 11 may include one of the semiconductor materials of InAlGaN, GaN, AlGaN, InGaN, AlN, InN, and the like and may be doped with a first conductive dopant such as Si, Ge, Sn, and the like. However, the materials of the first conductive semiconductor layer 11 are not limited thereto. The first conductive semiconductor layer 11 may include various other materials not described herein.

The active layer 12 may be disposed on the first conductive semiconductor layer 11 and may have a single or multiple quantum well structure. The active layer 12 may include AlGaN, InAlGaN, or the like.

According to some example embodiments of the present invention, a cladding layer doped with a conductive dopant may be positioned on an upper portion and/or a lower portion of the active layer 12. The cladding layer may include AlGaN, InAlGaN, or the like.

When an electric field exceeding a voltage (e.g., a predetermined voltage) is applied to both ends of the rod-like LED LD, electron-hole pairs are generated in the active layer 12, so that the rod-like LED LD emits light.

The second conductive semiconductor layer 13 may be provided on the active layer 12 and may include a semiconductor layer of a different type from the first conductive semiconductor layer 11. The second conductive semiconductor layer 13 may include at least one p-type semiconductor layer. The second conductive semiconductor layer 13 may include at least one of the semiconductor materials of InAlGaN, GaN, AlGaN, InGaN, AlN, and InN and may be doped with a second conductive dopant such as Mg, and the like. Material of the second conductive semiconductor layer 13 is not limited thereto. The second conductive semiconductor layer 13 may include various other materials not described herein.

The rod-like LED LD may include at least one of a phosphor layer, an active layer, a semiconductor layer and/or an electrode layer disposed on an upper and/or lower portion of each of the first conductive semiconductor layer 11, the active layer 12, and the second conductive semiconductor layer 13.

In addition, the rod-like LED LD may further include an insulation layer 14. The insulation layer 14 may be provided on a portion of the first conductive semiconductor layer 11, the active layer 12, and the second conductive semiconductor layer 13. For example, the insulation layer 14 may be provided at a portion except for both ends of the rod-like LED LD, so that both ends of the rod-like LED LD may be exposed.

As illustrated in FIG. 1, a portion of the insulation layer 14 is removed. But actually, all side surfaces of the road-like LED LD may be surrounded by the insulation layer 14.

The insulation layer 14 may be provided to surround at least a portion of the outer surface of the first conductive semiconductor layer 11, the active layer 12, and/or the second conductive semiconductor layer 13. For example, the insulation layer 14 may be provided to surround at least the outer surface of the active layer 12.

The insulation layer 14 may include a transparent insulating material. For example, the insulation layer 14 may include at least one insulating material selected from the group consisting of $SiO_2$, $Si_3N_4$, $Al_2O_3$ and $TiO_2$. However, the invention is not limited thereto, and various other insulating materials may be used.

When the insulation layer 14 is provided on the rod-like LED LD, it is possible to prevent the active layer 12 from being short-circuited to first and/or second electrodes. In addition, surface defects of the rod-like LED LD may be minimized by the insulation layer 14, so that lifetime and efficiency of the rod-like LED LD may be improved. When a plurality of rod-like LEDs LD are positioned adjacent to each other, the insulation layer 14 may prevent or reduce instances of unwanted shorts that may otherwise occur between the rod-like LEDs LD.

The rod-like LED LD may be used as a light emitting source for various display devices. For example, the rod-like LED LD may be used as a light emitting source of a lighting device or a self-emission display device.

Figure 2:
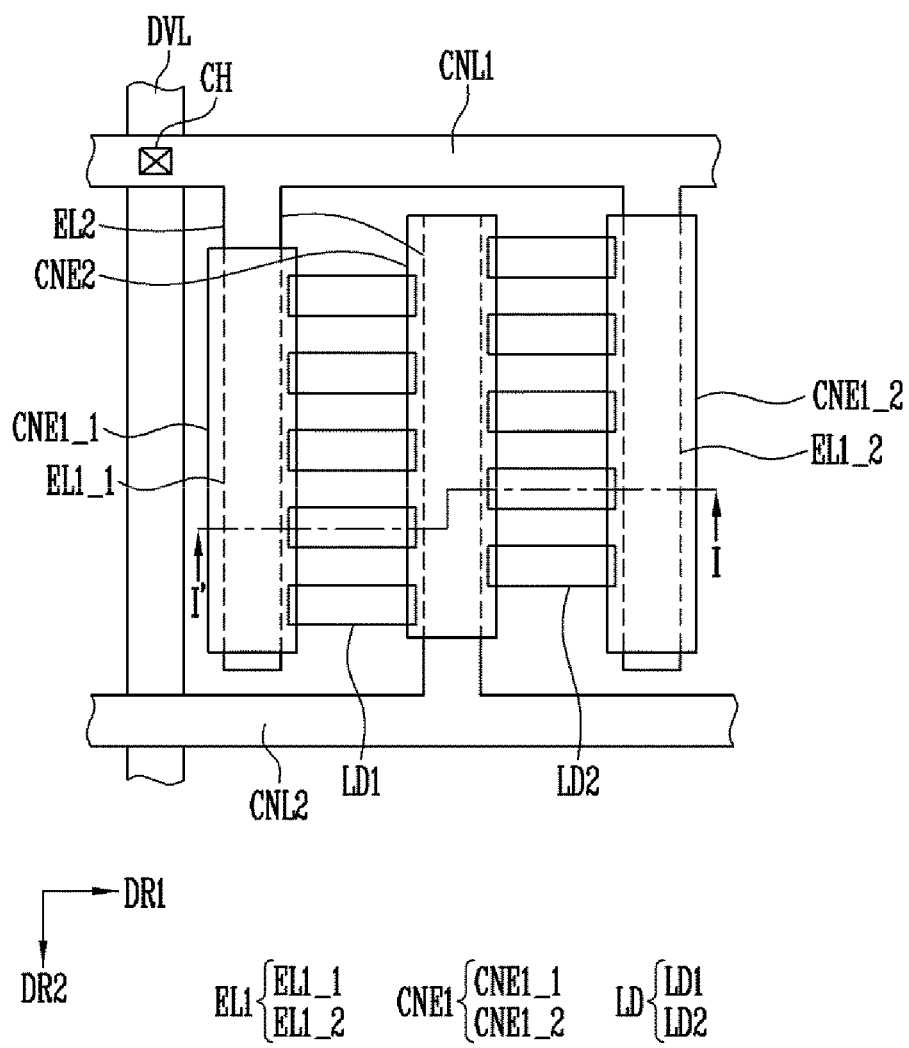
FIG. 2 is a plan view illustrating a unit light emitting region of a light emitting device including the rod-like light emitting diode shown in FIG. 1.
Figure 3:
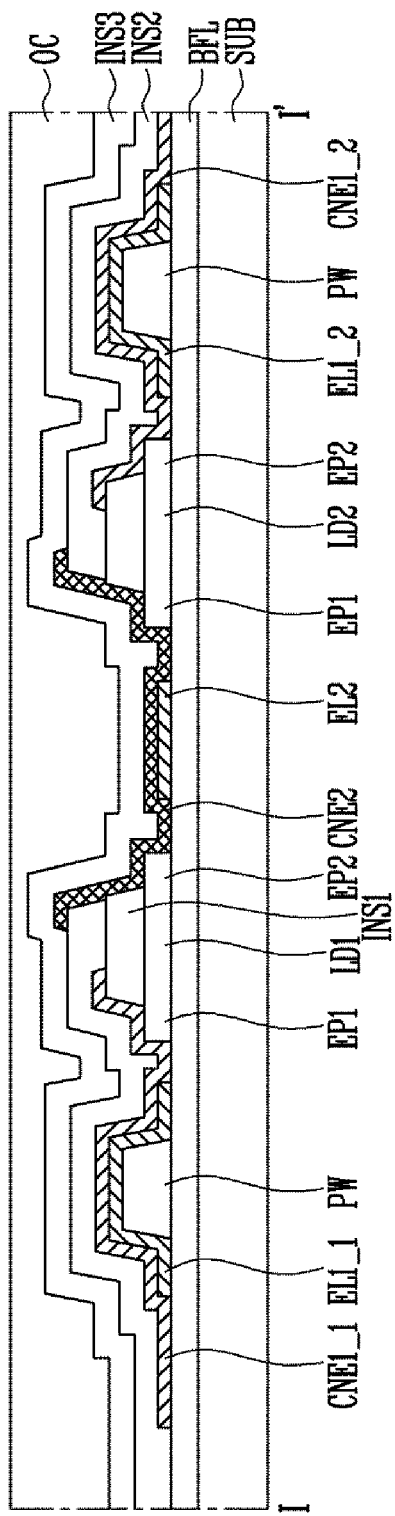
FIG. 3 is a cross-sectional view taken along the line I-I' of FIG. 2.

FIG. 2 is a plan view illustrating a unit light emitting region of a light emitting device including the rod-like light emitting diode shown in FIG. 1. FIG. 3 is a cross-sectional view taken along line I-I' of FIG. 2.

For convenience of illustration, although FIG. 2 shows rod-like LEDs aligned in a horizontal direction, the arrangement of the rod-like LEDs is not limited thereto. For example, the rod-like LEDs may be aligned in an oblique direction between the first electrode and the second electrode. In addition, in FIG. 2, the unit light emitting region may be a pixel region including one pixel PXL.

Referring to FIGS. 1 to 3, a light emitting device according to an embodiment of the invention may include a substrate SUB, a buffer layer BFL, a plurality of rod-like LEDs LD, a partition wall PW, first and second electrodes EL1 and El2, and first and second contact electrodes CNE1 and CNE2.

The substrate SUB may include an insulating material such as glass, organic polymer, quartz, or the like.

The buffer layer BFL may prevent impurities from diffusing into the rod-like LEDs LD.

Each of the rod-like LEDs LD may include the first conductive semiconductor layer 11, the second conductive semiconductor layer 13, and the active layer 12 positioned between the first conductive semiconductor layer 11 and the second conductive semiconductor layer 13. In addition, when viewed in a first direction DR1, each of the rod-like LEDs LD may include a first end EP1 and a second end EP2. One of the first conductive semiconductor layer 11 and the second conductive semiconductor layer 13 may be positioned at the first end EP1 and the other one of the first conductive semiconductor layer 11 and the second conductive semiconductor layer 13 may be positioned at the second end EP2. In an embodiment of the invention, each of the rod-like LEDs LD may emit light of one of red, green, blue, and white colors.

The rod-like LEDs LD may include a first rod-like LED LD1 arranged on the left side of the second electrode EL2 and a second rod-like LED LD2 arranged on the right side of the second electrode EL2. When viewed in a plan view, the first rod-like LED LD1 and the second rod-like LED LD2 may be spaced apart from each other with the second electrode EL2 interposed therebetween.

The partition wall PW may be positioned on the substrate SUB and may define a light emitting region in the unit light emitting region. Two partition walls PW adjacent to each other may be spaced apart from each other by a distance (e.g., a predetermined distance) on the substrate SUB. For example, two adjacent partition walls PW may be spaced apart on the substrate SUB by the length of each rod-like LED LD or more. The partition wall PW may be an insulating material including an inorganic material or an organic material, but is not limited thereto. The partition wall PW may include an opening corresponding to the rod-like LED LD.

A first insulation layer INS1 may be positioned on the substrate SUB including the partition wall PW. The first insulation layer INS1 may cover a portion of a top surface of each rod-like LED LD. The first end EP1 and the second end EP2 of each rod-like LED LD may be exposed to the outside by the first insulation layer INS1.

The first electrode EL1 may be disposed on the partition wall PW. The first electrode EL1 may be positioned adjacent to one end of the first and second ends EP1 and EP2 of each rod-like LED LD and may be electrically connected to the corresponding one of the first and second ends EP1 and EP2 by the first contact electrode CNE1.

When viewed in a plan view, the first electrode EU may include a (1-1)th electrode EL1_1 and a (1-2)th electrode EL1_2 branched to the left and right of the second electrode EL2. Accordingly, the second electrode EL2 may be positioned between the (1-1)th electrode EL1_1 and the (1-2)th electrode EL1_2. The (1-1)th electrode EL1_1 and the (1-2)th electrode EL1_2 may have a bar shape extending along a second direction DR2 intersecting the first direction DR1. The (1-1)th electrode EL1_1 and the (1-2)th electrode EL1_2 may be connected to each other by a first connection line CNL1 extending along the first direction DR1.

The second electrode EL2 may be provided between the first rod-like LED LD1 and the second rod-like LED LD2 on the substrate SUB. Concretely, the second electrode EL2 may be provide between the second end EP2 of the first rod-like LED LD1 and the first end EP1 of the second rod-like LED LD2 on the substrate SUB. The second electrode EL2 may be electrically connected to a second connection line CNL2.

One of the first and second electrodes EL1 and EL2 may be an anode electrode and the other of the first and second electrodes EU and EL2 may be a cathode electrode. In an embodiment of the invention, the first electrode EL1 may be a cathode electrode and the second electrode EL2 may be an anode electrode.

The first and second electrodes EL1 and EL2 are directly provided on the substrate SUB including the partition wall PW in the drawings, but the invention is not limited thereto. For example, an element for driving the light emitting device as an active matrix may further be provided between the first and second electrodes EL1 and EL2 and the substrate SUB. When the light emitting device is driven as the active matrix, signal lines, an insulation layer and/or a transistor may be provided between the first and second electrodes EU and EL2 and the substrate SUB. The signal lines may include a scan line, a data line, a driving voltage line DVL, and the like. The transistor may be connected to the signal lines and may include a gate electrode, a semiconductor layer, a source electrode, and a drain electrode.

One of the source and drain electrodes of the transistor may be connected to the second electrode EL2 through the second connection line CNL2. A data signal of the data line may be applied to the second electrode EL2 through the transistor. In addition, the driving voltage line DVL may be connected to the first connection line CNL1 through a contact hole CH and may be connected to the first electrode EL1. A signal of the driving voltage line DVL may be applied to the first electrode EL1 through the first connection line CNL1.

The first electrode EL1, the second electrode EL2, the first connection line CNL1, and the second connection line CNL2 may include the same material. For example, the first electrode EL1, the second electrode EL2, the first connection line CNL1, and the second connection line CNL2 may include a conductive material. The conductive material may include a metal such as Ag, Mg, Al, Pt, Pd, Au, Ni, Nd, Ir, Cr or an alloy thereof, a conductive oxide such as ITO (indium tin oxide), IZO (indium zinc oxide), ZnO (zinc oxide) or ITZO (indium tin zinc oxide), a conductive polymer such as PEDOT, or the like. The first electrode EL1, the second electrode EL2, the first connection line CNL1, and the second connection line CNL2 may be formed of a single layer, but the invention is not limited thereto. The first electrode EL1, the second electrode EL2, the first connection line CNL1, and the second connection line CNL2 may be formed of a multilayer in which two or more materials of metals, alloys, conductive oxides and conductive polymers are stacked.

The first contact electrode CNE1 may be disposed on the first electrode EL1. The first contact electrode CNE1 may include a (1-1)th contact electrode CNE1_1 and a (1-2)th contact electrode CNE1_2. When viewed in a plan view, the (1-1)th contact electrode CNE1_1 may overlap the first end EP1 of the first rod-like LED LD1 and the (1-1)th electrode EL1_1. In addition, when viewed in a plan view, the (1-2)th contact electrode CNE1_2 may overlap the second end EP2 of the second rod-like LED LD2 and the (1-2)th electrode EL1_2.

A second insulation layer INS2 may be positioned on the first contact electrode CNE1 to cover the first contact electrode CNE1.

The second contact electrode CNE2 may be positioned on the second electrode EL2. When viewed in a plan view, the second contact electrode CNE2 may cover the second electrode EL2 and overlap the second electrode EL2. In addition, the second contact electrode CNE2 may partially overlap the second end EP2 of the first rod-like LED LD1 and the first end EP1 of the second rod-like LED LD2.

A third insulation layer INS3 may be positioned on the second contact electrode CNE2 to cover the second contact electrode CNE2. The third insulation layer INS3 prevents the second contact electrode CNE2 from being exposed to the outside, so that corrosion of the second contact electrode CNE2 may be prevented or reduced. The third insulation layer INS3 may include one of an inorganic insulating material and an organic insulating material.

An overcoat layer OC may be positioned on the third insulation layer INS3. The overcoat layer OC may be a planarization layer that serves to flatten the surface roughened by the underlying components. In addition, the overcoat layer OC may be an encapsulating layer that prevents or reduces instances of oxygen and moisture penetrating into the rod-like LEDs LD.

As described above, the first end EP1 of the first rod-like LED LD1 may contact the (1-1)th electrode EL1_1 and the second end EP2 of the first rod-like LED LD1 may contact one side of the second electrode EL2. For example, the first conductive semiconductor layer 11 of the first rod-like LED LD1 may contact the (1-1)th electrode EL1_1 and the second conductive semiconductor layer 13 of the first rod-like LED LD1 may contact the one side of the second electrode EL2. Therefore, the first and second conductive semiconductor layers 11 and 13 of the first rod-like LED LD1 may receive a voltage (e.g., a predetermined voltage) through the (1-1)th electrode EL1_1 and the second electrode EL2. When an electric field exceeding the voltage (e.g., the predetermined voltage) is applied to the first and second ends EP1 and EP2 of the first rod-like LED LD1, the first rod-like LED LD1 emits light while the electron-hole pairs are generated in the active layer 12.

In addition, the first end EP1 of the second rod-like LED LD2 may contact the other side of the second electrode EL2 and the second end EP2 of the second rod-like LED LD2 may contact the (1-2)th electrode EL1_2. For example, the first conductive semiconductor layer 11 of the second rod-like LED LD2 may contact the (1-2)th electrode EL1_2 and the second conductive semiconductor layer 13 of the second rod-like LED LD2 may contact the other side of the second electrode EL2. Therefore, the first and second conductive semiconductor layers 11 and 13 of the second rod-like LED LD2 may receive a voltage (e.g., a predetermined voltage) through the (1-2)th electrode EL1_2 and the second electrode EL2. When an electric field exceeding the voltage (e.g., the predetermined voltage) is applied to the first and second ends EP1 and EP2 of the second rod-like LED LD2, the second rod-like LED LD2 emits light while the electron-hole pairs are generated in the active layer 12.

Figure 4:
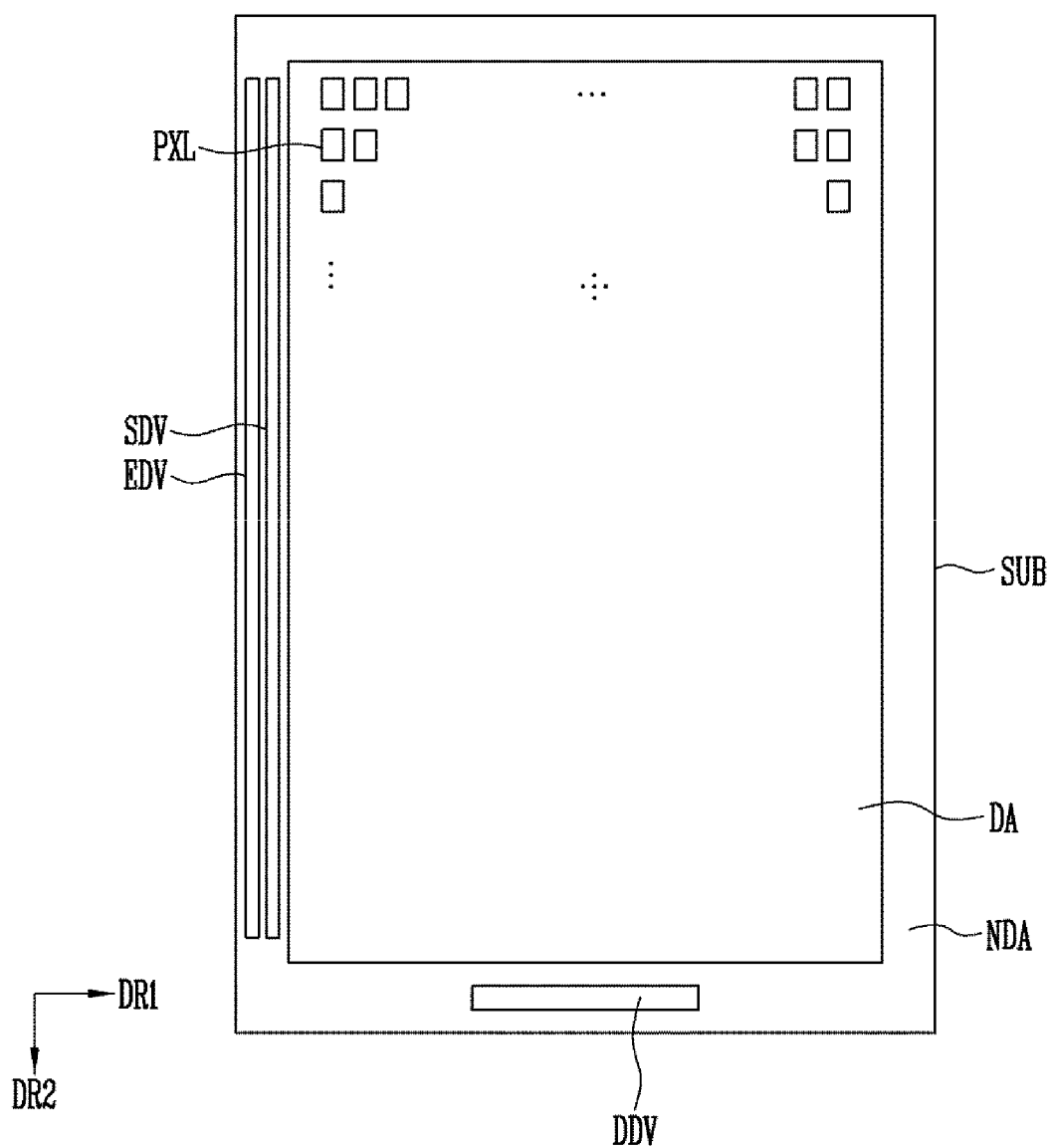
FIG. 4 is a schematic plan view of a display device according to an embodiment of the invention for illustrating, in particular, the display device using the rod-like LED shown in FIG. 1 as a light emitting source.

FIG. 4 is a schematic plan view of a display device according to some example embodiments of the invention for illustrating, for example, the display device using the rod-like LED shown in FIG. 1 as a light emitting source.

Referring to FIGS. 1 and 4, the display device according to some example embodiments of the present invention may include the substrate SUB, pixels PXL provided on one surface of the substrate SUB, a driving unit provided on the substrate SUB to drive the pixels PXL, and a line portion for connecting the pixels PXL and the driving unit.

The substrate SUB may include a display region DA and a non-display region NDA. The display region DA may be a region where the pixels PXL for displaying an image are provided. The non-display region NDA may be a region where the driving unit for driving the pixels PXL and a portion of the line portion for connecting the pixels PXL and the driving unit are provided.

The pixels PXL may be located in the display region DA of the substrate SUB. Each of the pixels PXL may be provided as a minimum unit for displaying an image. Each of the pixels PXL may include a light emitting element that emits white light and/or color light. Each pixel PXL may emit light of one of red, green, and blue colors, but is not limited thereto. For example, each pixel PXL may emit light of one of cyan, magenta, yellow, and white colors.

The pixels PXL may be arranged in a matrix form including rows extending in the first direction DR1 and columns extending in the second direction DR2 intersecting the first direction DR1. But the arrangement form of the pixels PXL is not particularly limited, and may be arranged in various forms.

The driving unit may supply signals to each pixel PXL through the line portion, so that the operation of the pixel PXL may be controlled. In FIG. 1, the line portion is not shown for convenience of explanation.

The driving unit may include a scan driver SDV for providing scan signals to the pixels PXL through scan lines, a light emitting driver EDV for providing light emission control signals to the pixels PXL through light emission control lines, a data driver DDV for providing data signals to the pixels PXL through data lines, and a timing controller. The timing controller may control the scan driver SDV, the light emitting driver EDV, and the data driver DDV.

Figure 5:
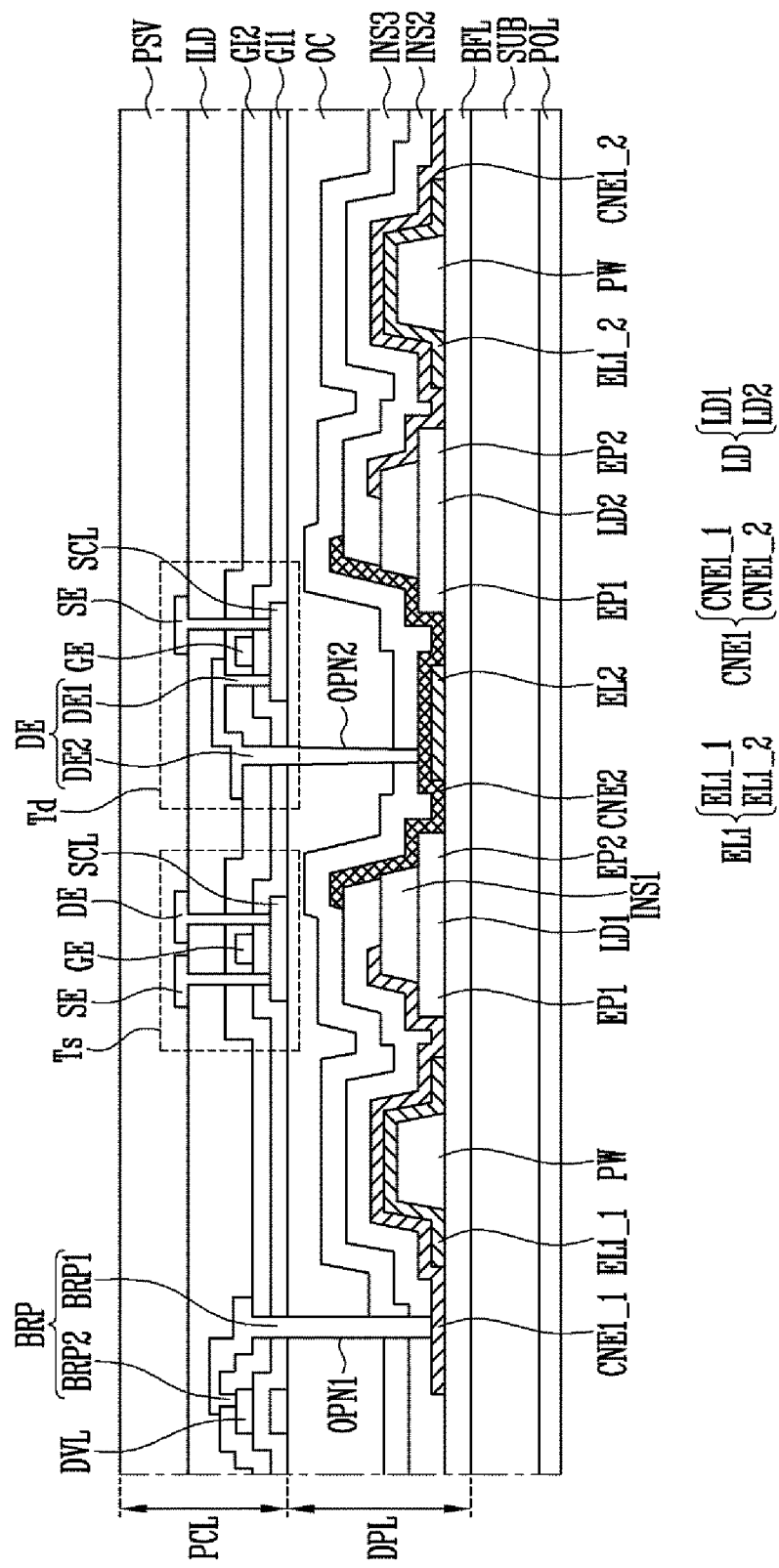
FIG. 5 is a cross-sectional view illustrating a portion of the display device shown in FIG. 4.

FIG. 5 is a cross-sectional view illustrating a portion of the display device shown in FIG. 4. In this embodiment of the invention, differences from the above-described embodiment are mainly described in order to avoid redundant description. The parts not specifically described in this embodiment accord with the above-described embodiment. The same numerals denote the same constituent elements and similar numerals denote similar constituent elements.

Referring to FIGS. 1 to 5, the display device according to an embodiment of the invention may include the substrate SUB, a display element layer DPL provided on the substrate SUB, and a pixel circuit portion PCL provided on the display element layer DPL.

The substrate SUB may include a transparent insulating material to transmit light. In addition, the substrate SUB may be a rigid substrate or a flexible substrate. The rigid substrate may include a glass substrate, a quartz substrate, a glass ceramic substrate, and a crystalline glass substrate. The flexible substrate may include a film substrate including a polymer organic material and a plastic substrate. For example, the flexible substrate may include a material selected from the group consisting of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In addition, the flexible substrate may include fiber glass reinforced plastic (FRP).

The material applied to the substrate SUB may preferably have resistance or heat resistance to a high processing temperature in the manufacturing process of the display device. In an embodiment of the invention, the substrate SUB may be entirely or at least partially flexible.

The display element layer DPL may include the buffer layer BFL, the rod-like LED LD, the first electrode EL1, the second electrode EL2, the first contact electrode CNE1, and the second contact electrode CNE2.

The buffer layer BFL may prevent impurities from diffusing into the rod-like LED LD. The buffer layer BFL may be provided as a single layer, but may also be provided as at least two or more layers. When the buffer layer BFL is provided in multiple layers, each layer may be formed of the same material or different materials. The buffer layer BFL may not be omitted depending on the material of the substrate SUB and the process conditions.

The rod-like LED LD may be positioned on the buffer layer BFL. The rod-like LED LD may include a first rod-like LED LD1 and a second rod-like LED LD2. Each of the first and second rod-like LEDs LD1 and LD2 may include the first conductive semiconductor layer 11, the second conductive semiconductor layer 13, and the active layer 13 positioned between the first and second conductive semiconductor layers 11 and 13. In addition, each of the first and second rod-like LEDs LD1 and LD2 may include the first end EP1 and the second end EP2 along the longitudinal direction. One of the first and second conductive semiconductor layers 11 and 13 may be disposed in the first end EP1 and the other one of the first and second conductive semiconductor layers 11 and 13 may be disposed in the second end EP2. Each of the first and second rod-like LEDs LD1 and LD2 may emit color light and/or white light.

The partition wall PW may be provided on the buffer layer BFL and may partition a light emitting region of the display device. The partition wall PW may include openings corresponding to the first and second rod-like LEDs LD1 and LD2.

The first insulation layer INS1 may be positioned on the buffer layer BFL including the partition wall PW. The first insulation layer INS1 may cover a portion of the top surface of each of the first and second rod-like LEDs LD1 and LD2. The first and second ends EP1 and EP2 of each of the first and second rod-like LEDs LD1 and LD2 may be exposed to the outside by the first insulating layer INS1.

The first electrode EL1 may be disposed on the partition wall PW. The first electrode EU may include the (1-1)th electrode EL1_1 arranged adjacent to the first end EP1 of the first rod-like LED LD1 and the (1-2)th electrode EL1_2 arranged adjacent to the second end EP2 of the second rod-like LED LD2.

The second electrode EL2 may be positioned on the buffer layer BFL between the first and second rod-like LEDs LD1 and LD2. One side of the second electrode EL2 may be arranged adjacently to the second end EP2 of the first rod-like LED LD1 and the other side of the second electrode EL2 may be arranged adjacent to the first end EP1 of the second rod-like LED LD2.

The first contact electrode CNE1 for electrically and/or physically connecting the first electrode EL1 and the rod-like LED LD may be provided on the first electrode EL1.

The first contact electrode CNE1 may include a transparent conductive material such as ITO (indium tin oxide), IZO (indium zinc oxide), or ITZO (indium tin zinc oxide) so as to transmit light emitted from the rod-like LED LD, but the invention is not limited thereto.

The first contact electrode CNE1 may include the (1-1)th contact electrode CNE1_1 provided on the (1-1)th electrode EL1_1 and the (1-2)th contact electrode CNE1_2 provided on the (1-2)th electrode EL1_2. The (1-1)th contact electrode CNE1_1 may be in ohmic contact with the first end EP1 of the first rod-like LED LD1 and the (1-2)th contact electrode CNE1_2 may be in ohmic contact with the second end EP2 of the second rod-like LED LD2.

The second insulation layer INS2 may be positioned on the substrate SUB including the first contact electrode CNE1. The second insulation layer INS2 may be an inorganic insulation layer including an inorganic material or an organic insulation layer including an organic material. The second insulation layer INS2 may cover the first contact electrode CNE1 and may prevent or reduce corrosion of the first contact electrode CNE1.

The second contact electrode CNE2 for electrically and/or physically connecting the second electrode EL2 and the first and second rod-like LEDs LD1 and LD2 may be disposed on the second electrode EL2. The second contact electrode CNE2 may include the same material as the first contact electrode CNE1, but is not limited thereto.

The second contact electrode CNE2 may cover the one side of the second electrode EL2 and the second end EP2 of the first rod-like LED LD1 and may be connected to the second electrode EL2 and the second end EP2 of the first rod-like LED LD1. In addition, the second contact electrode CNE2 may cover the other side of the electrode EL2 and the first end EP1 of the second rod-like LED LD2 and may be connected to the second electrode EL2 and the first end EP1 of the second rod-like LED LD2. One side of the second contact electrode CNE2 may be in ohmic contact with the second end EP2 of the first rod-like LED LD1 and the other side of the second contact electrode CNE2 may be in ohmic contact with the first end EP1 of the second rod-like LED LD2.

The third insulation layer INS3 may be positioned on the second contact electrode CNE2. The third insulation layer INS3 may cover the second contact electrode CNE2 positioned under the third insulating layer INS3 so as not to be exposed to the outside.

The overcoat layer OC may be positioned on the third insulation layer INS3. The overcoat layer OC may be a planarization layer that serves to flatten the surface roughened by the underlying components. In addition, the overcoat layer OC may be an encapsulating layer that prevents or reduces instances of oxygen and moisture penetrating into the first and second rod-like LEDs LD1 and LD2.

The pixel circuit portion PCL may be positioned on the overcoat layer OC. The pixel circuit portion PCL may include a first transistor Ts, a second transistor Td, a driving voltage line DVL, and a bridge pattern BRP.

The first transistor Ts may be a switching transistor electrically connected to the second transistor Td to switch the second transistor Td. The second transistor Td may be a driving transistor electrically connected to the rod-like LED LD to drive the rod-like LED LD.

Each of the first and second transistors Ts and Td may include a semiconductor layer SCL, a gate electrode GE, a source electrode SE, and a drain electrode DE.

The semiconductor layer SCL may be positioned on the overcoat layer OC. The semiconductor layer SCL may include a source region and a drain region which are in contact with the source electrode SE and the drain electrode DE, respectively. The region between the source region and the drain region may be a channel region. The semiconductor layer SCL may be a semiconductor pattern made of poly silicon, amorphous silicon, oxide semiconductor, or the like. The channel region may be a semiconductor pattern doped with an impurity. As the impurity, an n-type impurity, a p-type impurity, and other impurities such as metal may be used.

The gate electrode GE may be positioned on the semiconductor layer SCL with a first gate insulation layer GI1 interposed therebetween.

Each of the source electrode SE and the drain electrode DE of the first transistor Ts may be connected to the source region and the drain region of the corresponding semiconductor layer SCL through contact holes passing through an interlayer insulation layer ILD, a second gate insulation layer GI2, and the first gate insulation layer GI1.

The source electrode SE of the second transistor Td may be connected to the source region of the corresponding semiconductor layer SCL through a contact hole passing through the interlayer insulation layer ILD, the second gate insulation layer GI2, and the first gate insulation layer GI1.

In an embodiment of the invention, the drain electrode DE of the second transistor Td may be connected to the drain region of the corresponding semiconductor layer SCL through a contact hole passing through the second gate insulation layer GI2 and the first gate insulation layer GI1. In addition, the drain electrode DE of the second transistor Td may be connected to the second contact electrode CNE2 by a second opening OPN2 sequentially passing through the second gate insulation layer GI2, the first gate insulation layer GI1, the overcoat layer OC, and the third insulation layer INS3.

The drain electrode DE of the second transistor Td may include a first portion DE1 connected to the drain region of the semiconductor layer SCL and a second portion DE2 connected to the second contact electrode CNE2.

The driving voltage line DVL may be positioned on the first gate insulation layer GI1. A signal corresponding to a driving voltage may be supplied to the driving voltage line DVL from a driving unit.

The bridge pattern BRP may be positioned on the driving voltage line DVL with the second gate insulation layer GI2 interposed therebetween.

The bridge pattern BRP may be electrically connected to the driving voltage line DVL through a contact hole passing through the second gate insulation layer GI2. In addition, the bridge pattern BRP may be electrically connected to the (1-1)th contact electrode CNE1_1 by a first opening OPN1 sequentially passing through the second gate insulation layer GI2, the first gate insulation layer GI1, the overcoat layer OC, and the third insulation layer INS3.

In an embodiment of the invention, the bridge pattern BRP may include a first bridge pattern BRP1 electrically connected to the (1-1)th contact electrode CNE1_1 and a second bridge pattern BRP2 electrically connected to the driving voltage line DVL. The first and second bridge patterns BRP1 and BRP2 may be integrally provided and may be electrically and physically connected to each other. Although not shown in the drawings, the first opening OPN1 may be provided to expose a portion of the (1-2)th contact electrode CNE1_2 in the display device. The bridge pattern BRP may be electrically connected to the (1-2)th contact electrode CNE1_2 through the first opening OPN1.

The pixel circuit portion PCL may include a passivation layer PSV covering the first and second transistors Ts and Td. The passivation layer PSV may include at least one of an inorganic insulation layer including an inorganic material and an organic insulation layer including an organic material. For example, the passivation layer PSV may include an inorganic insulation layer and an organic insulation layer formed on the inorganic insulation layer.

As described above, the drain electrode DE of the second transistor Td may be electrically connected to the second contact electrode CNE2 disposed below the second transistor Td by the second opening OPN2. Accordingly, the second contact electrode CNE2 may receive a signal from the second transistor Td. The signal of the second transistor Td transmitted to the second contact electrode CNE2 may be finally applied to the second end EP2 of the first rod-like LED LD1.

The bridge pattern BRP electrically connected to the driving voltage line DVL may be electrically connected to the (1-1)th contact electrode CNE1_1 by the first opening OPN1. Therefore, the (1-1)th contact electrode CNE1_1 may receive a signal from the driving voltage line DVL. The signal transmitted to the (1-1)th contact electrode CNE1_1 may be finally applied to the first end EP1 of the first rod-like LED LD1.

Accordingly, the first rod-like LED LD1 may receive a voltage (e.g., a predetermined voltage) through the (1-1)th contact electrode CNE1_1 and the second contact electrode CNE2. When an electric field exceeding the voltage (e.g., the predetermined voltage) is applied to the first and second ends EP1 and EP2 of the first rod-like LED LD1, the first rod-like LED LD1 emits light while the electron-hole pairs are generated in the active layer 12 of the first rod-like LED LD1.

As described above, the first end EP1 of the second rod-like LED LD2 may contact the second contact electrode CNE2 and the second end EP2 of the second rod-like LED LD2 may contact the (1-2)th contact electrode CNE1_2. Therefore, the second rod-like LED LD2 may receive a voltage (e.g., a predetermined voltage) through the second contact electrode CNE2 and the (1-2)th contact electrode CNE1_2. When an electric field exceeding the voltage (e.g., the predetermined voltage) is applied to the first and second ends EP1 and EP2 of the second rod-like LED LD2, the second rod-like LED LD2 emits light while the electron-hole pairs are generated in the active layer 12 of the second rod-like LED LD2.

The display device may further include a polarizing film POL. The polarizing film POL may prevent external light from being reflected on the display device. The polarizing film POL may include a linear polarizer and a phase difference layer disposed on the linear polarizer.

The polarizing film POL may be positioned on the other surface of the substrate SUB on which the display element layer DPL is not provided. In particular, when the second contact electrode CNE2 is formed of a conductive material having a high reflectivity, the polarizing film POL may be positioned on the other surface of the substrate SUB. The second contact electrode CNE2 may be formed of a single layer made of Ag, or a triple layer including ITO/Ag/ITO.

When the second contact electrode CNE2 is formed of the conductive material having the high reflectivity, light emitted from the rod-like LED LD may be reflected toward the other surface of the substrate SUB by the second contact electrode CNE2. Therefore, the display device may display an image toward the other surface of the substrate SUB.

In general, a display device having a normal structure may include a structure in which a substrate, a pixel circuit portion provided on one surface of the substrate, and a display element layer provided on the pixel circuit portion are sequentially stacked. In particular, in the display device of the normal structure, the polarizing film may be provided on the overcoat layer of the display element layer. In the display device of the normal structure, the overcoat layer may have a curved surface due to a step difference between the display element layer and the pixel circuit portion positioned below the overcoat layer. When the polarizing film is provided on the curved surface of the overcoat layer, the polarizing film may not be fixed on the overcoat layer and may be partially detached from the overcoat layer. Such the partial detachment of the polarizing film may be visually recognized as a speckle or a spot, which may lead to poor image quality of the display device.

The display device according to an embodiment of the invention may have the polarizing film POL directly positioned on the other surface of the substrate SUB on which the display element layer DPL and the pixel circuit portion PCL are not provided. Because the polarizing film POL is provided directly on the other surface of the substrate SUB having a flat surface, defects of the image quality in the display device of the normal structure may be minimized.

In the display device of the normal structure, the display element layer may be formed on the substrate after the pixel circuit portion is formed on the substrate. The rod-like LED included in the display element layer may be manufactured by a metal-organic chemical vapor deposition (MOCVD) method in a high temperature condition of 800° C. to 900° C. The transistor included in the pixel circuit portion may be influenced during the manufacturing process of the rod-like LED, and the electrical characteristics of the transistor may be changed or malfunctioned. As a result, the display device may fail to operate.

In the display device according to an embodiment of the invention, the pixel circuit portion PCL may be formed structurally after the display element layer DPL is formed. Therefore, since the pixel circuit portion PCL is not affected by the manufacturing process of the display element layer DPL, defective driving of the display device may be prevented.

FIGS. 6 to 17 are cross-sectional views sequentially illustrating a method of manufacturing the display device shown in FIG. 5.

Figure 6:
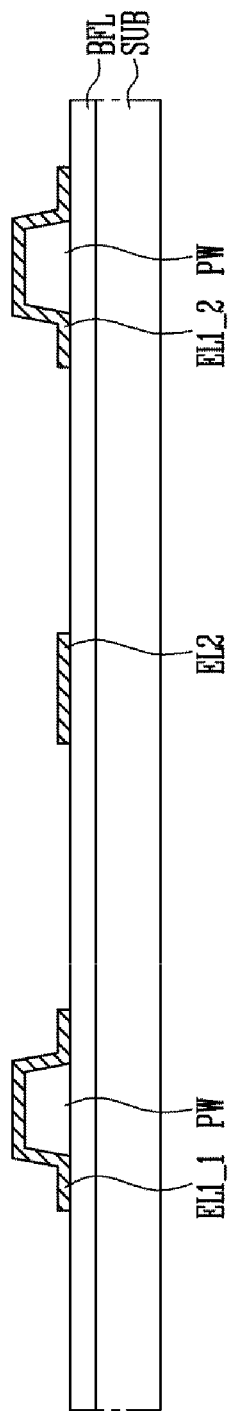
FIGS. 6 to 17 are cross-sectional views sequentially illustrating a method of manufacturing the display device shown in FIG. 5.

Referring to FIGS. 5 and 6, the buffer layer BFL may be formed on the substrate SUB and the partition wall PW may be formed on the buffer layer BFL. The (1-1)th electrode EL1_1, the (1-2)th electrode EL1_2, and the second electrode EL2 may be formed on the substrate SUB including the partition wall PW. The (1-1)th electrode EL1_1 and the (1-2)th electrode EL1_2 may be provided on the corresponding partition wall PW. The second electrode EL2 may be provided between the (1-1)th electrode EL1_1 and the (1-2)th electrode EL1_2.

Figure 7:
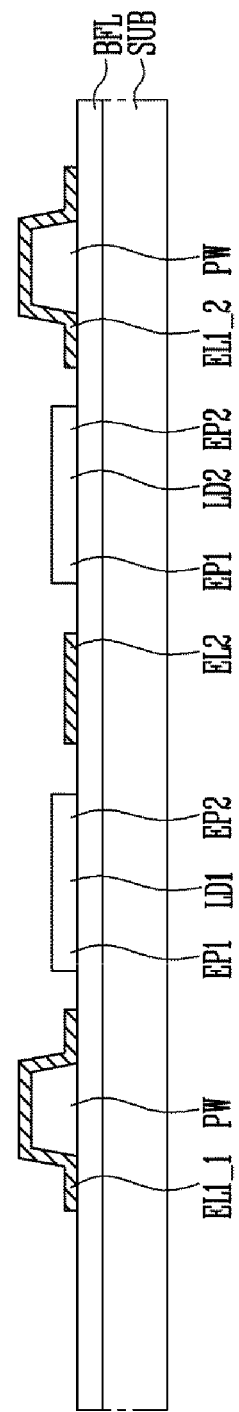

Referring to FIGS. 5 and 7, the first rod-like LED LD1 may be scattered on the substrate SUB with an electric field applied between the (1-1)th electrode EL1_1 and the second electrode EL2. In addition, the second rod-like LED LD2 may be scattered on the substrate SUB with an electric field applied between the second electrode EL2 and the (1-2)th electrode EL1_2.

As a non-limiting example of a method of scattering the first and second rod-like LEDs LD1 and LD2 on the substrate SUB on which the (1-1)th electrode EL1_1, the (1-2)th electrode EL1_2, and the second electrode EL2 are formed, an ink-jet printing method may be used. However, the invention is not limited thereto.

When the first and second rod-like LEDs LD1 and LD2 are provided, since the electric field is formed between the (1-1)th electrode EL1_1 and the second electrode EL2 and the electric field is formed between the second electrode EL2 and the (1-2)th electrode EL1_2, self-alignments of the scattered first and second rod-like LEDs LD1 and LD2 may be induced.

Figure 8:
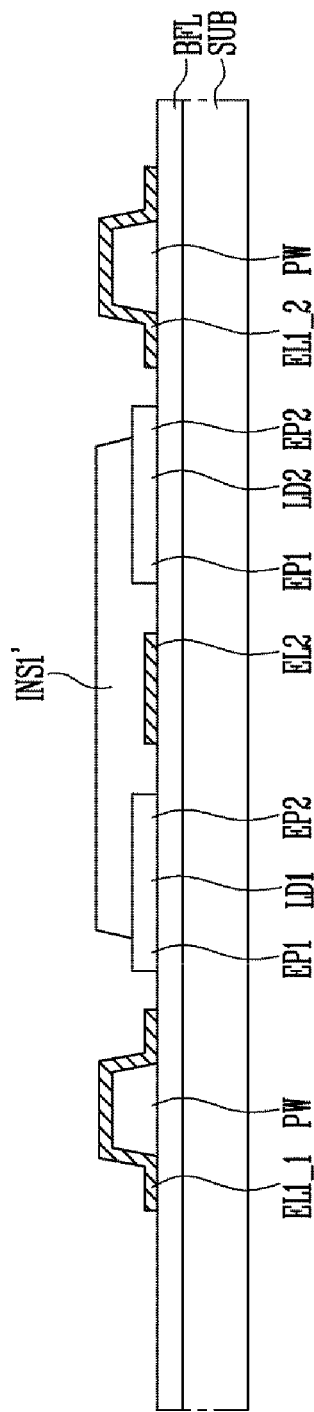

Referring to FIGS. 5 and 8, an insulating material layer may be coated on an entire surface of the substrate SUB on which the first and second rod-like LEDs LD1 and LD2 are aligned, and a mask process or the like may be performed to form a first insulation pattern INS1' that covers the second end EP2 of the first rod-like LED LD1 and the first end EP1 of the second rod-like LED LD2. The first end EP1 of the first rod-like LED LD1 and the second end EP2 of the second rod-like LED LD2 may be exposed to the outside.

Figure 9:
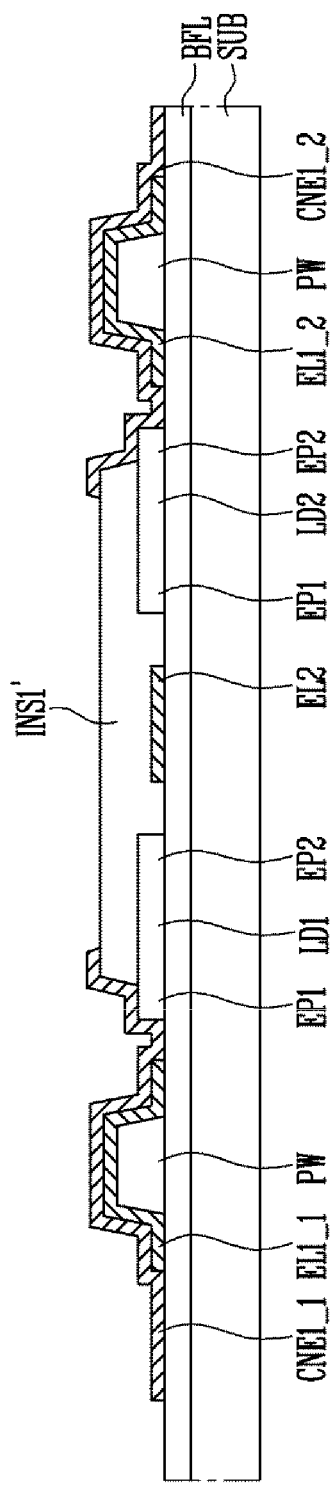

Referring to FIGS. 5 and 9, the (1-1)th contact electrode CNE1_1 and the (1-2)th contact electrode CNE1_2 may be formed on the substrate SUB including the first insulation pattern INS1'.

The (1-1)th contact electrode CNE1_1 may cover the (1-1)th electrode EL1_1 and the first end EP1 of the first rod-like LED LD1 and may be electrically connected to the (1-1)th electrode EL1_1 and the first end EP1 of the first rod-like LED LD1. That is, the (1-1)th contact electrode CNE1_1 may electrically and/or physically connect the (1-1)th electrode EL1_1 and the first end EP1 of the first rod-like LED LD1.

The interface between the first end EP1 of the first rod-like LED LD1 and the (1-1)th contact electrode CNE1_1 may be heat-treated by a rapid thermal annealing (RTA) process. As a result, the first end EP1 of the first rod-like LED LD1 and the (1-1)th contact electrode CNE1_1 may be in ohmic contact with each other.

The (1-2)th contact electrode CNE1_2 may cover the (1-2)th electrode EL1_2 and the second end EP2 of the second rod-like LED LD2 and may be electrically connected to the (1-2)th electrode EL1_2 and the second end EP2 of the second rod-like LED LD2. That is, the (1-2)th contact electrode CNE1_2 may electrically and/or physically connect the (1-2)th electrode EL1_2 and the second end EP2 of the second rod-like LED LD2.

The interface between the second end EP2 of the second rod-like LED LD2 and the (1-2)th contact electrode CNE1_2 may be heat-treated by a rapid thermal annealing (RTA) process. As a result, the second end EP2 of the second rod-like LED LD2 and the (1-2)th contact electrode CNE1_2 may be in ohmic contact with each other.

Figure 10:
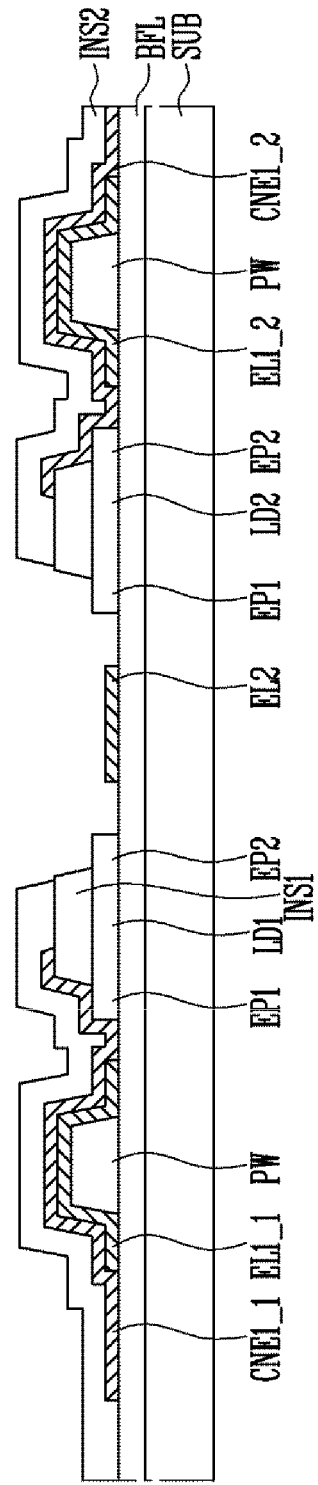

Referring to FIGS. 5 and 10, an insulating material layer may be coated on an entire surface of the substrate SUB including the (1-1)th contact electrode CNE1_1 and the (1-2)th contact electrode CNE1_2, and a mask process or the like may be performed to form the second insulation layer INS2 exposing the second electrode EL2, the second end EP2 of the first rod-like LED LD1, and the first end EP1 of the second rod-like LED LD2. The first insulation pattern INS1' may be patterned together during the mask process, so that the first insulation layer INS1 that exposes the second end EP2 of the first rod-like LED LD1, the second electrode EL2, and the first end EP1 of the second rod-like LED LD2 may be formed.

Figure 11:
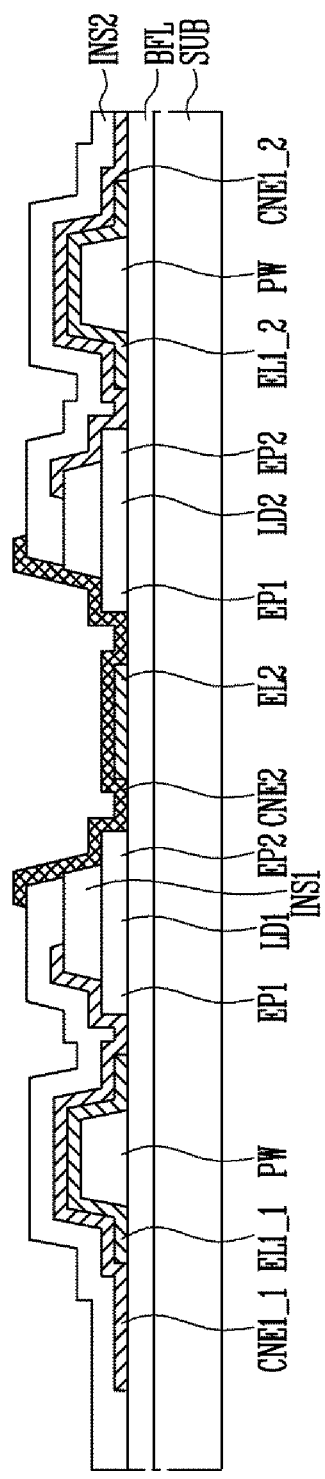

Referring to FIGS. 5 and 11, the second contact electrode CNE2 may be formed on the substrate SUB including the second insulation layer INS2. The second contact electrode CNE2 may cover the second electrode EL2, the second end EP2 of the first rod-like LED LD1, and the first end EP1 of the second rod-like LED LD2.

The second contact electrode CNE2 may be connected to the second end EP2 of the first rod-like LED LD1 and the second electrode EL2 and may electrically and/or physically connect the second end EP2 of the first rod-like LED LD1 and the second electrode EL2. In addition, the second contact electrode CNE2 may be connected to the first end EP1 of the second rod-like LED LD2 and the second electrode EL2 and may be electrically and/or physically connect the first end EP1 of the second rod-like LED LD2 and the second electrode EL2.

The interface between the second end EP2 of the first rod-like LED LD1 and the second contact electrode CNE2 may be heat-treated by a rapid thermal annealing (RTA) process. As a result, the second end EP2 of the first rod-like LED LD1 and the second contact electrode CNE2 may be in ohmic contact with each other. In addition, the interface between the first end EP1 of the second rod-like LED LD2 and the second contact electrode CNE2 may be heat-treated by the rapid thermal annealing (RTA) process. As a result, the first end EP1 of the second rod-like LED LD2 and the second contact electrode CNE2 may be in ohmic contact with each other.

Figure 12:
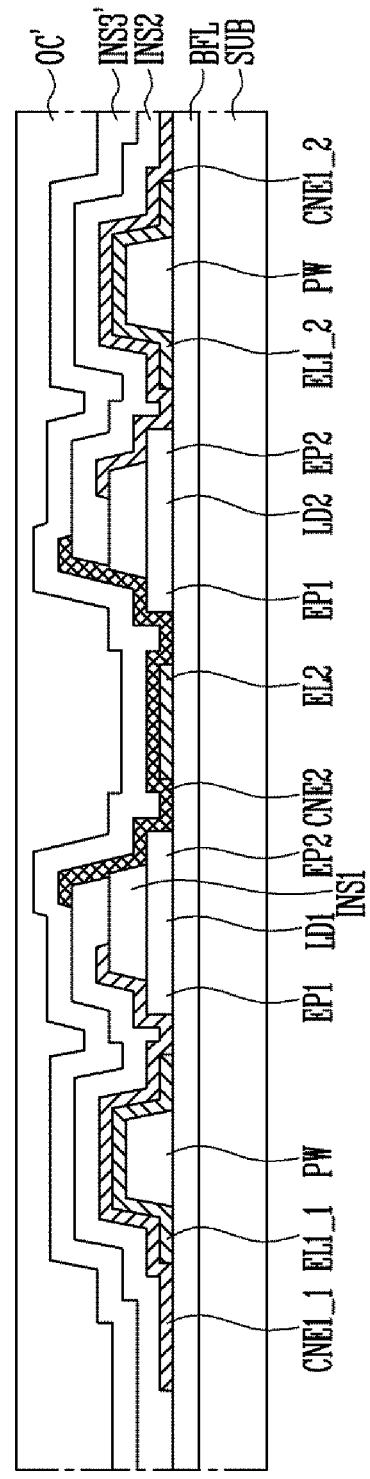

Referring to FIGS. 5 and 12, a third insulating material layer INS3' may be formed on an entire surface of the substrate SUB including the second contact electrode CNE2. The third insulating material layer INS3' may cover the second contact electrode CNE2 and may prevent or reduce corrosion of the second contact electrode CNE2.

Next, an overcoat material layer OC' may be formed on the third insulating material layer INS3'. The overcoat material layer OC' may serve to flatten the surface roughened by the components disposed below the overcoat material layer OC'. In addition, the overcoat material layer OC' may prevent oxygen and moisture from the outside from penetrating into the first and second rod-like LEDs LD1 and LD2.

Figure 13:
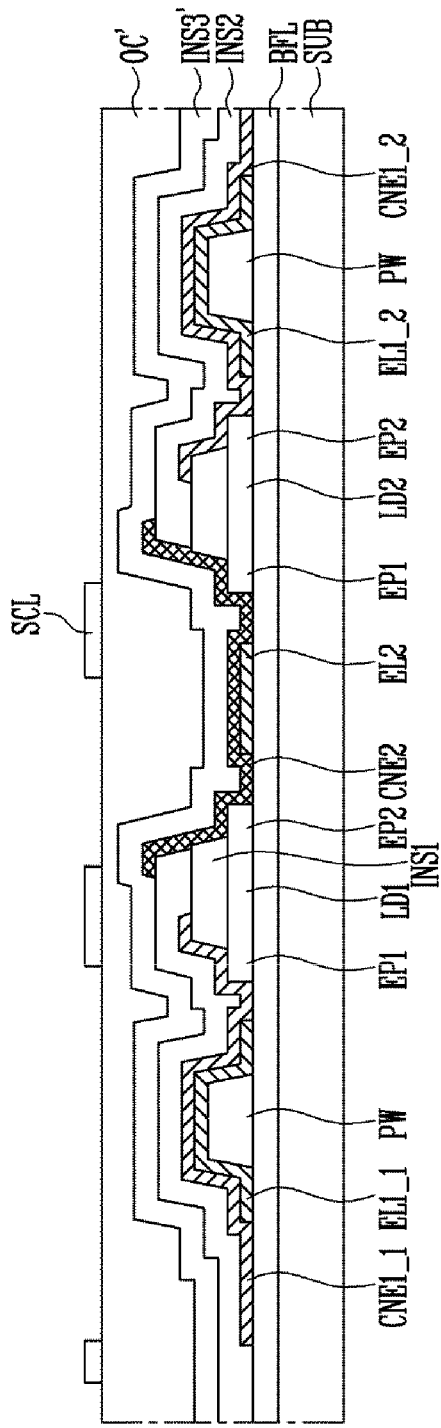

Referring to FIGS. 5 and 13, the semiconductor layers SCL of the first and second transistors Ts and Td may be formed on the overcoat material layer OC'. The semiconductor layers SCL may be semiconductor patterns made of poly silicon, amorphous silicon, oxide semiconductor, or the like.

Figure 14:
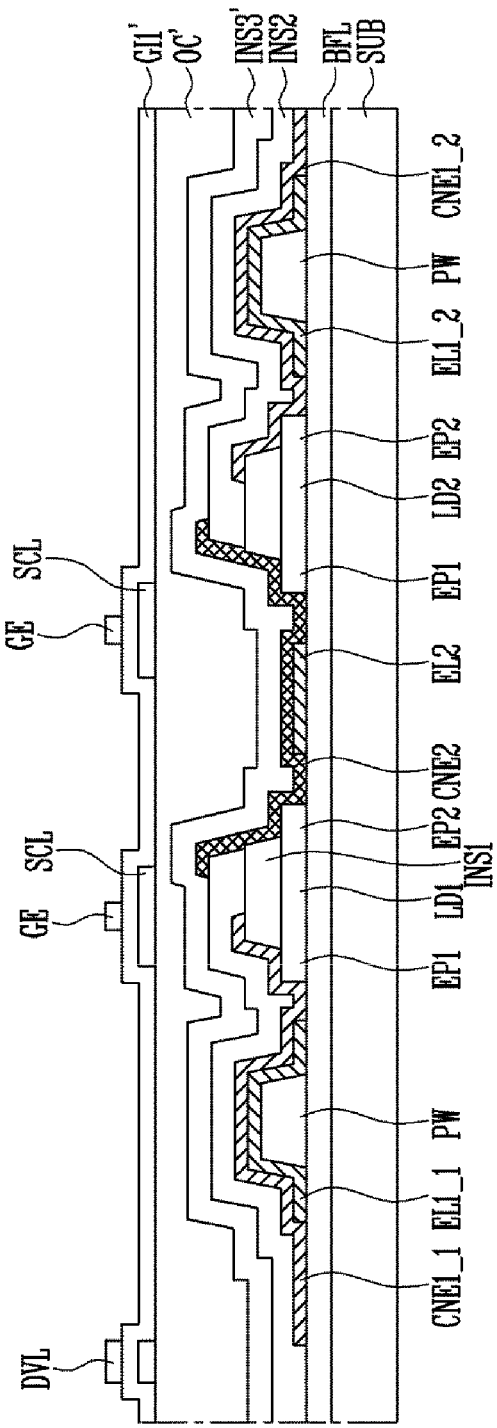

Referring to FIGS. 5 and 14, a first gate insulating material layer may be formed on an entire surface of the overcoat material layer OC' including the semiconductor layers SCL and the gate electrodes of the first and second transistors Ts and Td and the driving voltage line DVL may be formed on the first gate insulating material layer GI1'.

The gate electrode GE and the driving voltage line DVL may include at least one selected from the group consisting of aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and alloys thereof. The gate electrode GE may be electrically insulated from the corresponding semiconductor layer SCL by the first gate insulating material layer GI1'.

Figure 15:
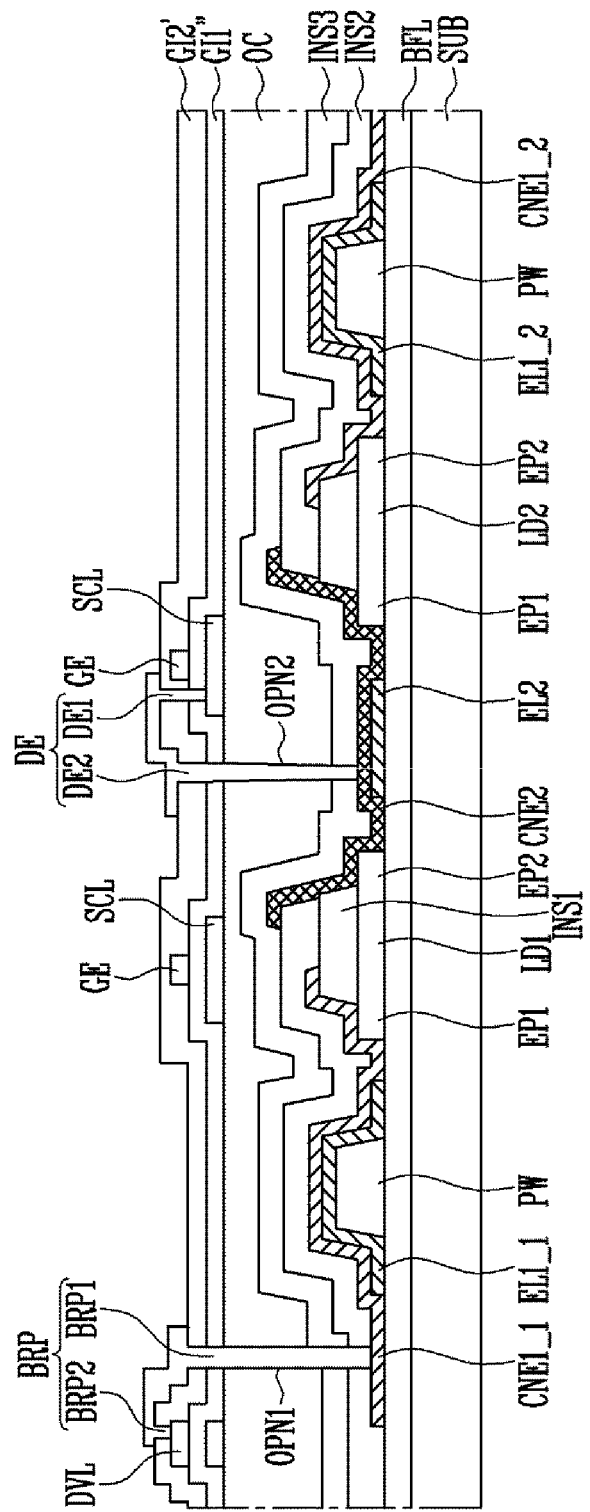

Referring to FIGS. 5 and 15, an insulating material layer may be coated on an entire surface of the first gate insulating material layer GI1' including the gate electrode GE and the driving voltage line DVL, and a mask process or the like may be performed to form a second gate insulating material layer GI2' that exposes a portion of the driving voltage line DVL. The first gate insulating material layer GI1' corresponding to a portion of the (1-1)th contact electrode CNE1_1 and a portion of the second contact electrode CNE2 may be exposed by the second gate insulating material layer GI2' formed by the mask process. In addition, the first gate insulating material layer GI1' corresponding to a portion of the semiconductor layer SCL of the second transistor Td may be exposed by the second gate insulating material layer GI2'.

The first gate insulating material layer GI1' may be patterned together during the mask process, so that a first gate insulation pattern GI1" that exposes the overcoat material layer OC' corresponding to the portion of the (1-1)th contact electrode CNE1_1 and the portion of the second contact electrode CNE2 may be formed. In addition, a portion of the semiconductor layer SCL of the second transistor Td may be exposed by the first gate insulation pattern GI1".

The overcoat material layer OC' may be patterned together during the mask process, so that the overcoat layer OC that exposes the third insulating material layer INS3' corresponding to the portion of the (1-1)th contact electrode CNE1_1 and the portion of the second contact electrode CNE2 may be formed.

The third insulating material layer INS3' may be patterned together during the mask process, so that the third insulation layer INS3 that exposes the portion of the (1-1)th contact electrode CNE1_1 and the portion of the second contact electrode CNE2 may be formed.

In an embodiment of the invention, the (1-1)th contact electrode CNE1_1 may be exposed to the outside by the first opening OPN1 sequentially passing through the second gate insulating material layer GI2', the first gate insulation pattern GI1", the overcoat layer OC, and the third insulation layer INS3. The second contact electrode CNE2 may be exposed to the outside by the second opening OPN2 sequentially passing through the second gate insulating material layer GI2', the first gate insulation pattern GI1", the overcoat layer OC, and the third insulation layer INS3.

Next, the bridge pattern BRP and the drain electrode DE may be formed on the second gate insulating material layer GI2'.

The bridge pattern BRP may be electrically connected to the (1-1)th contact electrode CNE1_1 and the exposed driving voltage line DVL, respectively. The bridge pattern BRP may include the first bridge pattern BRP1 electrically connected to the (1-1)th contact electrode CNE1_1 through the first opening OPN1 and the second bridge pattern BRP2 electrically connected to the driving voltage line DVL. The first bridge pattern BRP1 and the second bridge pattern BRP2 may be integrally provided and may be electrically and physically connected to each other.

The drain electrode DE may be connected to the drain region of the semiconductor layer SCL of the second transistor Td and the second contact electrode CNE2, respectively. The drain electrode DE may include the first portion DE1 electrically connected to the drain region of the semiconductor layer SCL of the second transistor Td and the second portion DE2 electrically connected to the second contact electrode CNE2 through the second opening OPN2. The first portion DE1 and the second portion DE2 may be integrally provided and may be electrically and physically connected to each other.

Figure 16:
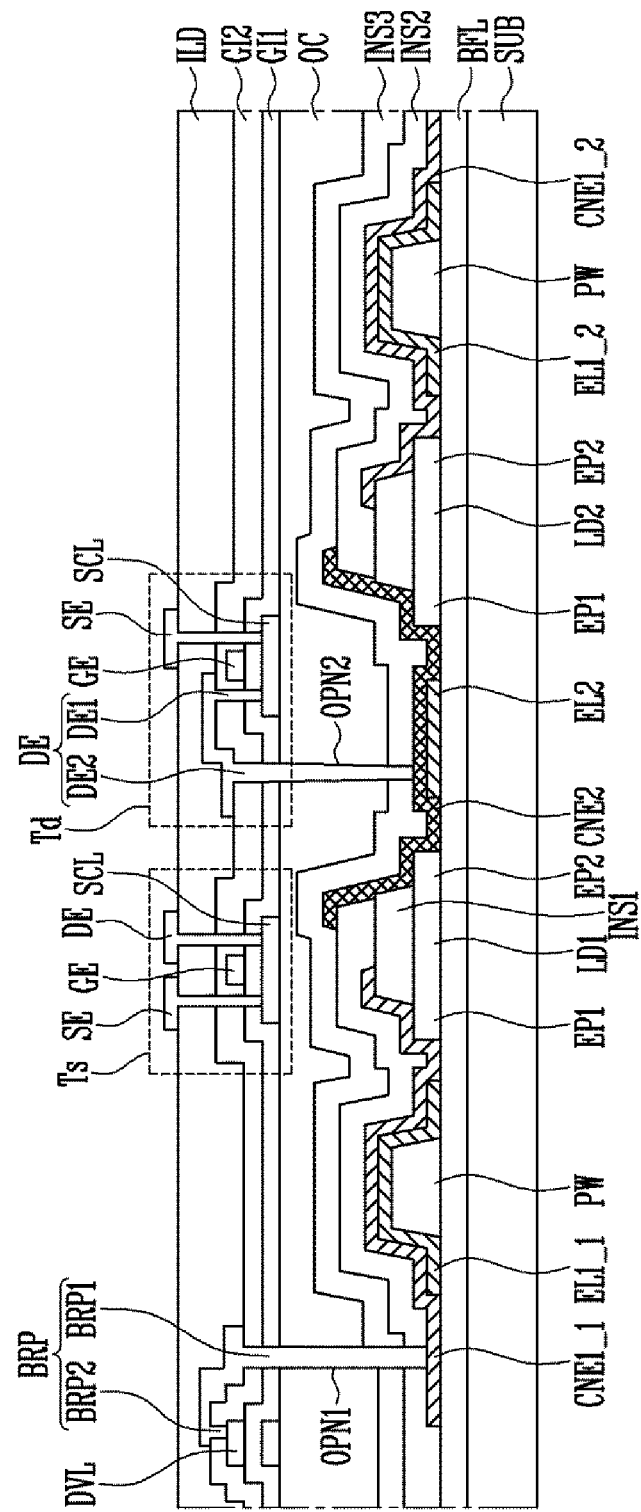

Referring to FIGS. 5 and 16, an insulating material may be coated on the second gate insulating material layer GI2' including the bridge pattern BRP and the drain electrode DE, and a mask process or the like may be performed to form the interlayer insulation layer ILD that exposes a portion of the second gate insulating material layer GI2' corresponding to a portion of the semiconductor layer SCL of each of the first and second transistors Ts and Td.

The second gate insulating material layer GI2' may be patterned together during the mask process, so that the second gate insulation layer GI2 exposing the portion of the semiconductor layer SCL of each of the first and second transistors Ts and Td may be formed.

The first gate insulation pattern GI1" may be patterned together during the mask process, so that the first gate insulation layer GI1 exposing the portion of the semiconductor layer SCL of each of the first and second transistors Ts and Td may be formed.

The source and drain electrodes SE and DE of the first transistor Ts and the source electrode SE of the second transistor Td may be formed on the interlayer insulation layer ILD.

The source electrode SE of the first transistor Ts may be connected to the source region of the corresponding semiconductor layer SCL through a contact hole sequentially passing through the interlayer insulation layer ILD, the second gate insulation layer GI2, and the first gate insulation layer GI1.

The drain electrode DE of the first transistor Ts may be connected to the drain region of the corresponding semiconductor layer SCL through a contact hole sequentially passing through the interlayer insulation layer ILD, the second gate insulation layer GI2, and the first gate insulation layer GI1.

In addition, the source electrode SE of the second transistor Td may be connected to the source region of the corresponding semiconductor layer SCL through a contact hole sequentially passing through the interlayer insulation layer ILD, the second gate insulation layer GI2, and the first gate insulation layer GI1.

Figure 17:
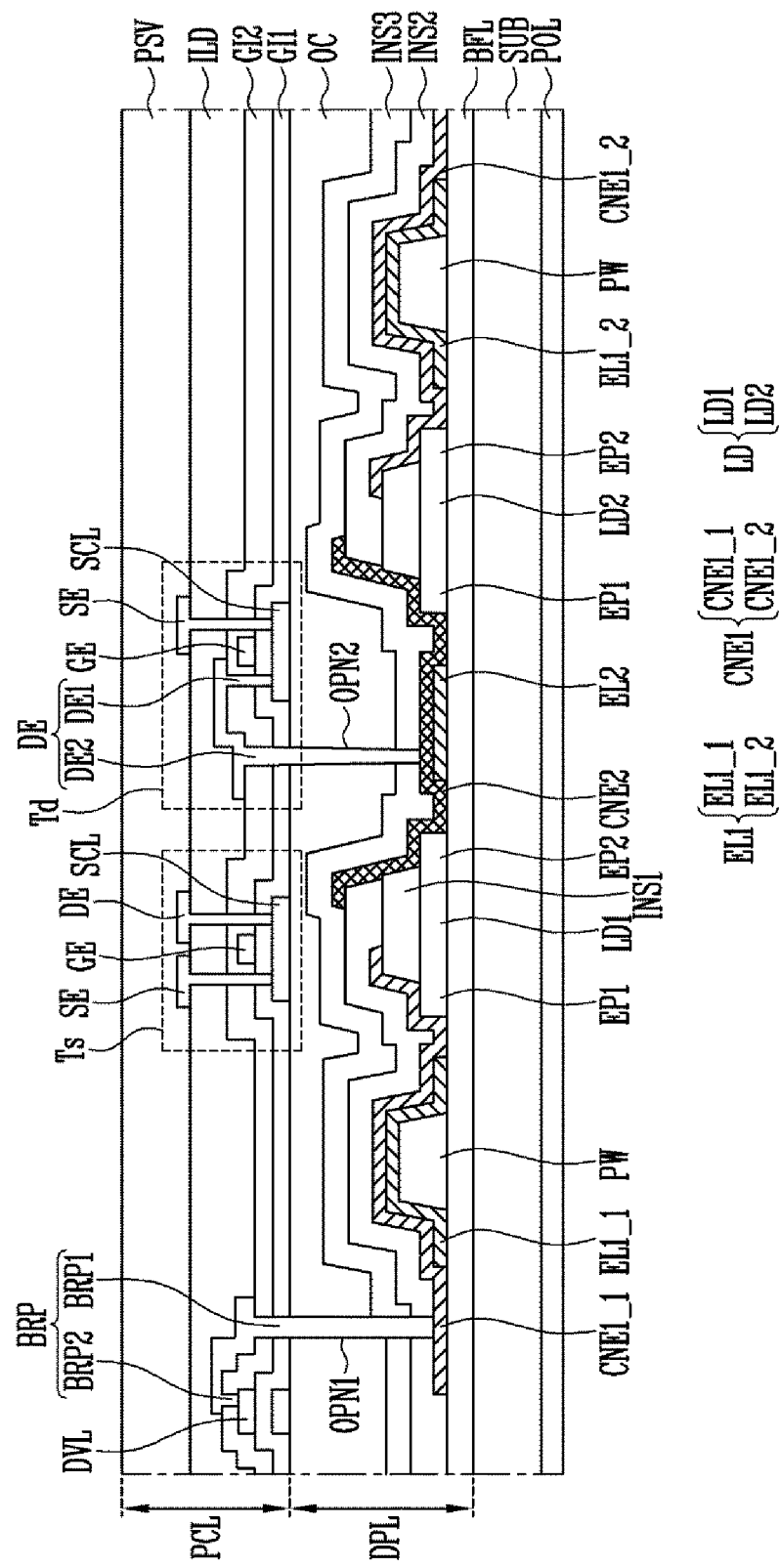

Referring to FIGS. 5 and 17, the passivation layer PSV may be formed on the source and drain electrodes SE and DE of the first transistor Ts and the source electrode SE of the second transistor Td. The passivation layer PSV may cover the source and drain electrodes SE and DE of the first transistor Ts and the source electrode SE of the second transistor Td. In addition, the passivation layer PSV may prevent corrosion of the source and drain electrodes SE and DE of the first transistor Ts and the source electrode SE of the second transistor Td.

Next, the polarizing film POL may be provided on the other surface of the substrate SUB on which the first and second rod-like LEDs LD1 and LD2 and the first and second transistors Ts and Td are not provided. The polarizing film POL may be directly attached to the other surface of the substrate SUB which is a flat surface.

Figure 18:
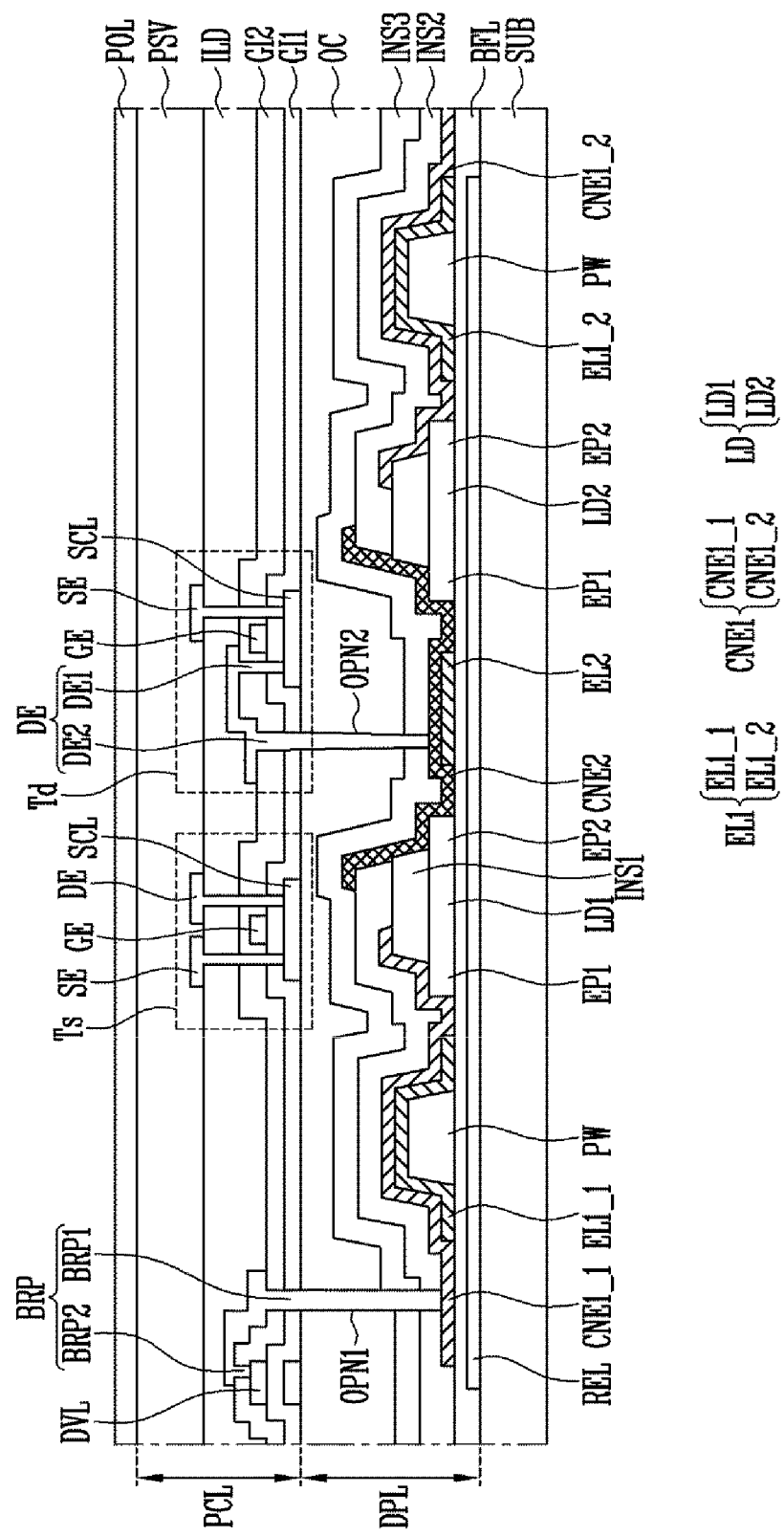
FIG. 18 is a cross-sectional view illustrating a display device according to some example embodiments of the invention.

FIG. 18 is a cross-sectional view illustrating a display device according to another embodiment of the invention. In another embodiment of the invention, different points from the above-described embodiment will be described in order to avoid redundant description. The parts not specifically described in this embodiment accord with the above-described embodiment, and the same numerals denote same constituent elements, and similar numerals denote similar constituent elements.

The display device shown in FIG. 18 may be substantially the same as or similar to the display device shown in FIG. 5 except that a reflective electrode is further positioned between the substrate and the display element layer, and a polarizing film is positioned on the pixel circuit portion.

Referring to FIGS. 5 and 18, the display device according to another embodiment of the invention may include the substrate SUB, the display element layer DPL positioned on one surface of the substrate SUB, and a pixel circuit portion PCL provided on the display element layer DPL.

A reflective electrode REL may be positioned between the substrate SUB and the display element layer DPL. In an embodiment of the invention, the reflective electrode REL may be made of a conductive material having a high reflectivity. The reflective electrode REL may be provided on the substrate SUB corresponding to the first and second rod-like LEDs LD1 and LD2, the first and second electrodes EU and EL2, and the first and second contact electrodes CNE1 and CNE2 included in the display element layer DPL.

The reflective electrode REL may reflect light emitted from the first and second rod-like LEDs LD1 and LD2 toward the upper surface of the substrate SUB. Accordingly, the display device may be realized to have a top emission structure so that the display device displays an image on the upper surface of the substrate SUB.

In the display device having the above-described structure, the polarizing film POL may be positioned on the pixel circuit portion PCL. The polarizing film POL may be positioned on the passivation layer PSV of the pixel circuit portion PCL to prevent external light from being reflected from the display device.

According to an embodiment of the invention, the display device which can improve reliability by preventing defects and the method of manufacturing the display device may be provided.

The display device according to an embodiment of the invention may be employed in various electronic devices. For example, the display device may be applied to a television, a notebook, a mobile phone, a smart phone, a smart pad (PD), a PMP, a PDA, a navigation device, various wearable devices such as a smart watch, or the like.

As described above, the optimal embodiments of the invention have been disclosed through the detailed description and the drawings. It is to be understood that the terminology used herein is for the purpose of describing the invention only and is not used to limit the scope of the invention described in the claims. Therefore, those skilled in the art will appreciate that various modifications and equivalent embodiments are possible without departing from the scope of the invention. Accordingly, the true scope of the invention should be determined by the technical idea of the appended claims, and their equivalents.

What is claimed is:

1. A display device comprising:
    a pixel configured to emit light of a first color in a display area, the pixel comprising:
        a substrate;
        a light emitting element on one surface of the substrate and configured to emit the light of the first color, the light emitting element having a lower surface adjacent to the substrate and an upper surface facing the lower surface in a thickness direction of the substrate;
        a first electrode on the one surface of the substrate, on the upper surface of the light emitting element, and electrically connected to one end of the light emitting element;
        a second electrode on the one surface of the substrate, on the upper surface of the light emitting element, and electrically connected to another end of the light emitting element;
        an insulation layer on the first electrode, the second electrode, and the upper surface of the light emitting element, the insulation layer having a first opening exposing a portion of the second electrode; and a transistor on the insulation layer and electrically connected to the light emitting element, wherein the insulation layer is between the upper surface of the light emitting element and the transistor, and wherein the second electrode is electrically connected to the transistor through the first opening.

2. The display device of claim 1, further comprising a first conductive electrode adjacent to the one end of the light emitting element and a second conductive electrode adjacent to the other end of the light emitting element, wherein the first conductive electrode and the second conductive electrode are spaced apart from each other with the light emitting element interposed therebetween.

3. The display device of claim 2, wherein the first conductive electrode comprises a cathode electrode, and the second conductive electrode comprises an anode electrode.

4. The display device of claim 3, wherein the first electrode is on the first conductive electrode and the one end of the light emitting element and electrically connects the first conductive electrode and the one end of the light emitting element, and wherein the second electrode is on the second conductive electrode and the other end of the light emitting element and electrically connects the second conductive electrode and the other end of the light emitting element.

5. The display device of claim 4, wherein the insulation layer comprises:

a first insulation layer on the second electrode; and a second insulation layer on the first insulation layer and flattening a surface of the first insulation layer, wherein the first opening penetrates through the first and second insulation layers to expose the portion of the second electrode, wherein the insulation layer has a second opening exposing a portion of the first electrode, and wherein the second opening penetrates through the first and second insulation layers to expose the portion of the first electrode.

6. The display device of claim 5, wherein the transistor comprises:

a semiconductor layer on the second insulation layer;

a gate electrode on the semiconductor layer with a first gate insulation layer interposed therebetween; and source and drain electrodes connected to the semiconductor layer, and wherein the drain electrode has a first portion connected to the semiconductor layer and a second portion connected to the second electrode through the second opening.

7. The display device of claim 6, wherein the drain electrode is on the gate electrode with a second gate insulation layer interposed therebetween, and the source electrode is on the drain electrode with an interlayer insulating layer interposed therebetween.

8. The display device of claim 6, wherein the second electrode is a reflective electrode configured to reflect light emitted from the light emitting element toward another surface of the substrate facing the one surface.

9. The display device of claim 8, further comprising a polarizing film on the other surface of the substrate facing the one surface.

10. The display device of claim 6, further comprising a reflective electrode between the one surface of the substrate and the light emitting element.

11. The display device of claim 10, wherein the reflective electrode reflects the light emitted from the light emitting element toward the one surface of the substrate.

12. The display device of claim 11, further comprising a polarizing film on the other surface of the substrate facing the one surface.

13. The display device of claim 6, further comprising:

a driving voltage line on the first gate insulation layer; and a bridge pattern on a second gate insulation layer and electrically connected to the driving voltage line and the first electrode.

14. The display device of claim 13, wherein the bridge pattern comprises a first bridge pattern connected to the first electrode through the second opening and a second bridge pattern connected to the driving voltage line, and wherein the first bridge pattern and the second bridge pattern are integrally provided.

15. The display device of claim 14, wherein the first electrode is electrically connected to the driving voltage line through the bridge pattern.

* * * * *